United States Patent
Wang

(10) Patent No.: US 9,245,876 B2
(45) Date of Patent: Jan. 26, 2016

(54) LIGHT EMITTING DIODE ASSEMBLY, BACKLIGHT MODULE, LIQUID CRYSTAL DISPLAY AND ILLUMINATION DEVICE

(71) Applicants: BOE TECHNOLOGY GROUP CO., LTD., Beijing (CN); BOE OPTICAL SCIENCE AND TECHNOLOGY CO., LTD., Suzhou (CN)

(72) Inventor: Tao Wang, Beijing (CN)

(73) Assignees: BOE TECHNOLOGY GROUP CO., LTD., Beijing (CN); BOE OPTICAL SCIENCE AND TECHNOLOGY CO., LTD., Suzhou (CN)

( * ) Notice: Subject to any disclaimer, the term of this patent is extended or adjusted under 35 U.S.C. 154(b) by 0 days.

(21) Appl. No.: 14/590,909

(22) Filed: Jan. 6, 2015

(65) Prior Publication Data

US 2015/0340345 A1 Nov. 26, 2015

(30) Foreign Application Priority Data

May 23, 2014 (CN) .......................... 2014 1 0221693

(51) Int. Cl.
*H01L 25/075* (2006.01)
*G02F 1/1335* (2006.01)
(Continued)

(52) U.S. Cl.
CPC .............. *H01L 25/0753* (2013.01); *F21K 9/00* (2013.01); *F21K 9/1355* (2013.01); *F21K 9/1375* (2013.01); *F21K 9/175* (2013.01); *F21K 9/30* (2013.01); *G02F 1/133603* (2013.01); *H01L 33/48* (2013.01); *H01L 33/483* (2013.01);
(Continued)

(58) Field of Classification Search
CPC ..... F21V 19/001; H01L 33/48; H01L 33/483; H01L 33/486; H01L 25/0753; F21K 9/00; F21K 9/1355; F21K 9/1375; F21K 9/175; F21K 9/30; G02F 1/33603; Y10S 362/80
See application file for complete search history.

(56) References Cited

U.S. PATENT DOCUMENTS 8,953,926 B1 * 2/2015 Kelly et al. .................... 385/146
2007/0195524 A1 8/2007 Seo et al.
(Continued)

FOREIGN PATENT DOCUMENTS

| CN | 102130105 | 7/2011 |
|----|-----------|--------|
| CN | 202013882 | 10/2011 |
| JP | 2010003644 | 1/2010 |

OTHER PUBLICATIONS

Chinese Office Action with English Language Translation, dated Nov. 3, 2014, Chinese Application No. 201410221693.7.

*Primary Examiner* — Armando Rodriguez
(74) *Attorney, Agent, or Firm* — Blakely Sokoloff Taylor & Zafman LLP

(57) ABSTRACT

The present disclosure relates to the technical field of light emission of an LED and discloses a light emitting diode assembly, a backlight module, a liquid crystal display and an illumination device. The LED assembly comprises a lamp base and at least one pair of LED dies. The lamp base has a mounting groove. A pair of the LED dies are mounted at a bottom surface of the mounting groove, and two LED dies in the pair of LED dies are disposed symmetrically about an axis of the mounting groove. Among angles formed by intersection of planes where light exit surfaces of the two LED dies lie, an angle facing the bottom surface of the mounting groove is greater than 0 degree and less than 180 degrees. The light emitting diode assembly has a larger light exit angle and exhibits a simple structure.

10 Claims, 2 Drawing Sheets

(51) Int. Cl.
*F21K 99/00* (2010.01)
*H01L 33/48* (2010.01)
*F21V 19/00* (2006.01)

(52) U.S. Cl.
CPC .............. *H01L33/486* (2013.01); *F21V 19/001* (2013.01); *Y10S 362/80* (2013.01)

(56) References Cited

U.S. PATENT DOCUMENTS

2009/0116216 A1   5/2009   Kim et al.
2013/0032828 A1*  2/2013   Hsu ................................ 257/88

\* cited by examiner

LIGHT EMITTING DIODE ASSEMBLY, BACKLIGHT MODULE, LIQUID CRYSTAL DISPLAY AND ILLUMINATION DEVICE

RELATED APPLICATIONS

The present application claims the benefit of Chinese Patent Application No. 201410221693.7, filed on May 23, 2014, the entire disclosure of which is incorporated herein by reference.

BACKGROUND OF THE DISCLOSURE

1. Field of the Disclosure

The present disclosure relates to the technical field of light emission of an LED, and particularly to a light emitting diode assembly, a backlight module, a liquid crystal display and an illumination device.

2. Description of the Prior Art

Currently a mainstream method of increasing a light exit angle of an LED is to add a lens at a surface of the LED. For example, N plus of Japan holds a patent application in this regard. The method of adding the lens at the surface of the LED may expand the light exit angle and can ensure even distribution of light intensity. However, this method requires use of the lens and is structurally complicated.

SUMMARY OF THE DISCLOSURE

The present disclosure provides a light emitting diode assembly, a backlight module, a liquid crystal display and an illumination device, wherein the LED assembly has a larger light exit angle and a simple structure.

To achieve the above object, the present disclosure provides the following technical solutions:

a light emitting diode assembly, comprising:

a lamp base having a mounting groove;

at least one pair of LED dies, wherein each pair of the LED dies is mounted at a bottom surface of the mounting groove, two LED dies in each pair of LED dies are disposed symmetrically about an axis of the mounting groove, and among angles formed by intersection of planes where light exit surfaces of the two LED dies lie, an angle facing the bottom surface of the mounting groove is greater than 0 degree and less than 180 degrees.

In the above LED assembly, the bottom surface of the mounting groove of the lamp base is mounted with at least one pair of LED dies, two LED dies in each pair of LED dies are disposed symmetrically about an axis of the mounting groove, and among angles formed by intersection of planes where light exit surfaces of the two LED dies lie, an angle facing the bottom surface of the mounting groove is greater than 0 degree and less than 180 degrees. Therefore, a light emitting scope of each LED die deviates in a direction away from the other LED die so that the light exit angle of the entire light emitting diode assembly is enabled to expand.

Therefore, the light emitting diode assembly may expand its light exit angle without using a lens and exhibits a simple structure.

According to one aspect of the present disclosure, the angle facing towards the bottom surface of the mounting groove is greater than 120 degrees and less than 180 degrees, and it is ensured that the light emitting scopes of the two LED dies in a pair of LED dies overlap, whereupon even if only a pair of LED dies are mounted at the bottom surface of the mounting groove, no dim area occurs in the light emitting scope of the light emitting diode assembly.

According to an aspect of the present disclosure, bases are provided at the bottom surface of the mounting groove, and each of said LED dies is mounted on one of the bases.

According to an aspect of the present disclosure, a lateral side of the mounting groove is a conical surface structure, and the bottom surface of the mounting groove is a convex surface structure which is convex towards an opening of the mounting groove, and an axis of the convex surface structure coincides with an axis of the conical surface structure. Since two LED dies are disposed symmetrically about an axis b of the mounting groove, uniformity of light emission of the LED assembly is ensured. Alternatively, the lateral side of the mounting groove is a conical surface structure, the bottom surface of the mounting groove is a plane, and a cross section of the base has a wedge structure.

According to an aspect of the present disclosure, when the bottom surface of the mounting groove is a convex surface structure which is convex towards the opening of the mounting groove, the bottom surface of mounting groove is a semispherical structure; or the bottom surface of the mounting groove is a convex surface structure with a plurality of facets spliced together.

According to an aspect of the present disclosure, the bottom surface of the mounting groove is further provided with a metal joint, a metal wire is provided in each of the bases, one electrode of each of said LED dies is electrically connected to the metal joint via a metal wire, and the other electrode of each of said LED dies is electrically connected to the metal wire in the corresponding base via a metal wire.

According to an aspect of the present disclosure, the light emitting diode assembly further comprises encapsulating glue which covers the whole surface of the opening of the mounting groove of the lamp base, a surface of the encapsulating glue is in an outwardly convex arcuate shape, and an outwardly convex height is less than or equal to twice a thickness of the LED die.

The present disclosure further provides a backlight module, comprising a light source which includes any light emitting diode assembly provided in the above technical solutions.

The present disclosure further provides a liquid crystal display, including the backlight module provided in the above technical solution.

The present disclosure further provides an illumination device, comprising any light emitting diode assembly provided in the above technical solutions.

DETAILED DESCRIPTION OF THE PRESENT DISCLOSURE

The following clearly and completely describes the technical solutions in the embodiments of the present disclosure with reference to the accompanying drawings in the embodiments of the present disclosure. Obviously, the described embodiments are merely a part rather than all of the embodiments of the present disclosure. All other embodiments obtained by persons of ordinary skill in the art based on the embodiments of the present disclosure without creative efforts shall fall within the protection scope of the present disclosure.

Figure 1:
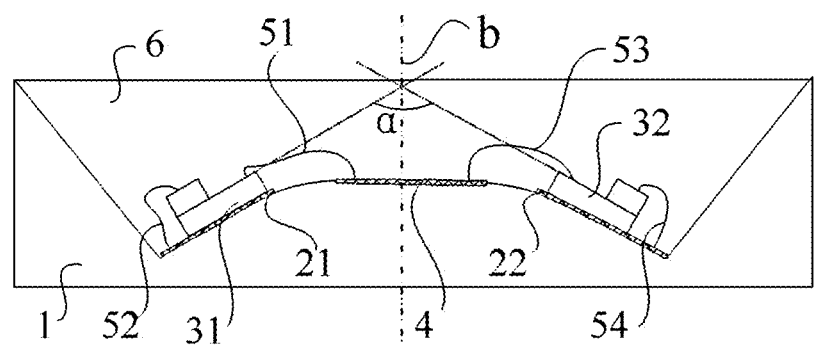
FIG. 1 is a structural schematic view of a light emitting diode assembly according to an embodiment of the present disclosure.
Figure 2:
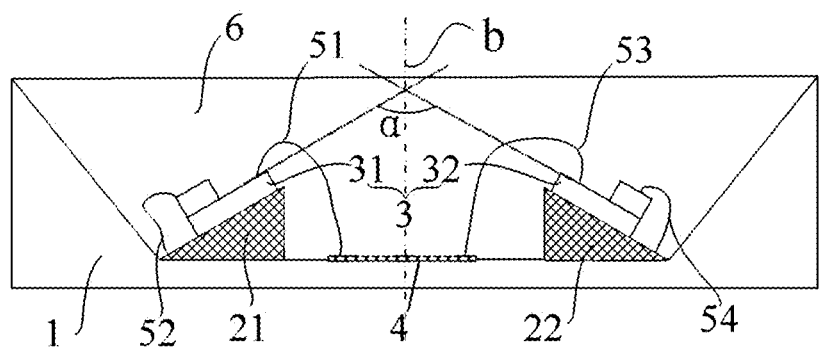
FIG. 2 is a structural schematic view of a light emitting diode assembly according to another embodiment of the present disclosure.

Please refer to FIG. 1 and FIG. 2. FIG. 1 is a structural schematic view of a light emitting diode assembly according to an embodiment of the present disclosure; FIG. 2 is a structural schematic view of a light emitting diode assembly according to another embodiment of the present disclosure.

The light emitting diode assembly according to the embodiment of the present disclosure comprises a lamp base 1 having a mounting groove; and at least one pair of LED dies 3, an LED die 31 and an LED die 32 as shown in FIG. 2.

Each pair of LED dies 3 are mounted at a bottom surface of the lamp base 1 having the mounting groove, and the two LED dies in each pair of LED dies 3 are disposed symmetrically about an axis b of the mounting groove. Take the LED die 31 and LED die 32 shown in FIG. 2 as an example. The LED die 31 and LED die 32 are disposed symmetrically about an axis b of the mounting groove, and among angles formed by a plane where a light exit surface of the LED die 31 lies intersecting a plane where a light exit surface of the LED die 32 lies, an angle α facing the bottom surface of the mounting groove is greater than 0 degree and less than 180 degrees. As shown in FIGS. 1 and 2, the light exit surface of the LED die 31 is the top surface of the LED die 31 away from the base 21; and the light exit surface of the LED die 32 is the top surface of the LED die 32 away from the base 22.

Figure 4:
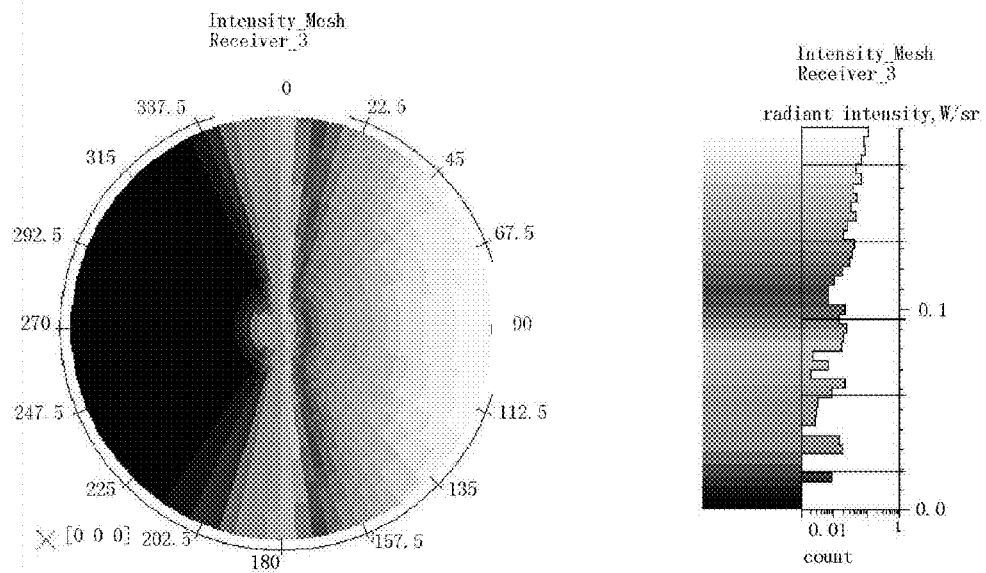
FIG. 4 is a diagram illustrating the relationship between light intensity and angle of the light emitting diode assembly according to the present disclosure.
Figure 5:
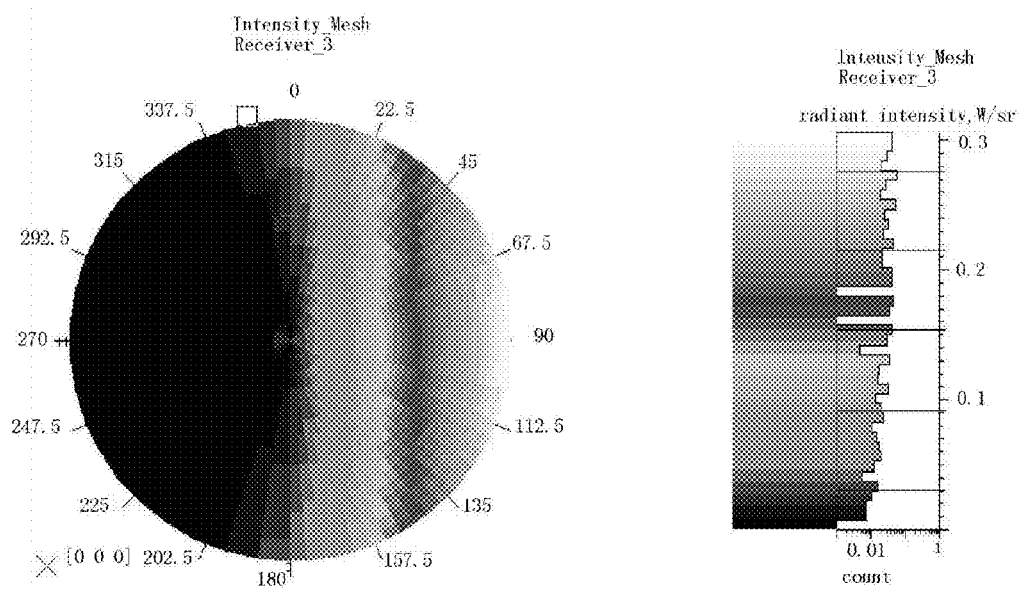
FIG. 5 is a diagram illustrating the relationship between light intensity and angle of an ordinary light emitting diode assembly in the prior art.

Please refer to FIG. 4 and FIG. 5. FIG. 4 is a diagram illustrating relationship between light intensity and angle of the light emitting diode assembly according to the present disclosure, and FIG. 5 is a diagram illustrating relationship between light intensity and angle of an ordinary light emitting diode assembly in the prior art.

The portions on the right side in FIG. 4 and FIG. 5 are light intensity diagrams. The brightness of light as shown gradually falls from up to down. Generally, the light exit angle of the light emitting diode assembly refers to an angle formed by light emitting edges of a light emitting body when the brightness at the light emitting edges attenuates to 80% of the brightness at the center of the light emitting body. As can be seen from FIG. 4 and FIG. 5, the light exit angle of the light emitting diode assembly according to the present disclosure is evidently greater than the light exit angle of the light emitting diode assembly in the prior art.

In the above LED assembly, a pair of LED dies 3 shown in FIG. 2 is taken as an example. In the pair of LED dies 3, the LED die 31 and LED die 32 are disposed symmetrically about an axis b of the mounting groove, and among angles formed by intersection of planes where the light exit surfaces of LED die 31 and LED die 32 lies, an angle α facing the bottom surface of the mounting groove is greater than 0 degree and less than 180 degrees. Therefore, light emitting scopes of the LED die 31 and LED die 32 deviate in a direction away from each other so that the light exit angle of the entire light emitting diode assembly is enabled to expand.

The LED die 31 and LED die 32 are further taken as an example. Assume that the light exit angle of the light exit surface of the LED die 31 and that of the light exit surface of the LED die 32 both are 120 degrees and a lateral side of the mounting groove dos not shield the light rays emitted by the LED die 31 and LED die 32, when the above angle α is for example 155 degrees, the light exit angle of the light emitting diode assembly is 145 degrees, and such light exit angle expands by 25 degrees as compared with a light emitting diode assembly having an ordinary structure in the prior art.

Therefore, the above light emitting diode assembly may expand its light exit angle without using a lens and exhibits a simple structure.

In an embodiment, the angle α is greater than 120 degrees and less than 180 degrees. Assume that a light exit angle formed by an LED die is 120 degrees, it is ensured that the light emitting scopes of the LED die 31 and LED die 32 overlap, whereupon even if only a pair of LED dies 3 are mounted on the bottom surface of the mounting groove, no dim area occurs in the light emitting scope of the light emitting diode assembly.

In an embodiment, bases are provided at the bottom surface of the mounting groove, and each LED die is mounted on one of the bases. As shown in FIG. 1 and FIG. 2, the bottom surface of the mounting groove is provided with a base 21 and a base 22, the LED die 31 is mounted on the base 21, and the LED die 32 is mounted on the base 22.

On the basis of the above embodiments, further referring to FIG. 2, a lateral side of the mounting groove is a conical surface structure, and among angles formed by the plane where a light exit surface of the LED die 31 lies intersecting a plane where a light exit surface of the LED die 32 lies, an angle α facing the bottom surface of the mounting groove is greater than 0 degree and less than 180 degrees. This is specifically implemented in the following manners:

Manner 1: as shown in FIG. 1, the bottom surface of the mounting groove in the lamp base 1 is a convex surface structure which is convex towards an opening of the mounting groove, and an axis of the convex surface structure of the bottom surface of the mounting groove coincides with an axis of the conical surface structure of the lateral side of the mounting groove. Therefore, the axis of the convex surface structure of the bottom surface of the mounting groove coincides with an axis b of the mounting groove. Since the LED die 31 and LED die 32 are disposed symmetrically about an axis b of the mounting groove, the LED die 31 and LED die 32 are mounted symmetrically on both sides of the axis of the convex surface structure of the bottom surface so that the light exit surfaces of the LED die 31 and LED die 32 form the above angle α, and uniformity of light emission of the LED assembly is ensured.

For example, when the bottom surface of the mounting groove is a convex surface structure which is convex towards the opening of the mounting groove, the bottom surface of mounting groove is a semi-spherical structure; or the bottom surface of the mounting groove may be a convex surface structure with a plurality of facets spliced together. Certainly, the bottom surface of the mounting groove may have other structures, which will not be detailed here.

Manner 2: as shown in FIG. 2, the bottom surface of the mounting groove in the lamp base 1 is a plane, and a cross section of the bases has a wedge structure. As shown in FIG. 2, cross sections of the base 21 and the base 22 have a wedge structure, the LED die 31 is mounted on the base 21, the LED die 32 is mounted on the base 22, and the positions of the base 21 and the base 22 are arranged in a way that the angle α formed between the light exit surface of the LED die 31 and the light exit surface of the LED die 32 is greater than zero and less than 180 degrees.

On the basis of above embodiments, when the bottom surface of the mounting groove is provided with the base 21 and base 22, the bottom surface of the mounting groove is further provided with a metal joint 4, a metal wire is provided in both the base 21 and base 22, one electrode of the LED die 31 is electrically connected to the metal joint 4 via a metal wire 51, and the other electrode is electrically connected to the metal wire in the base 21 via a metal wire 52; one electrode of the LED die 32 is electrically connected to the metal joint 4 via a metal wire 53, and the other electrode is electrically connected to the metal wire in the base 22 via a metal wire 54.

Figure 3:
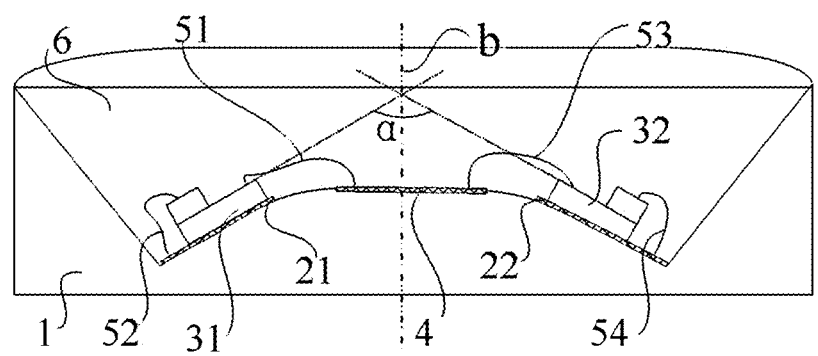
FIG. 3 is a structural schematic view of a light emitting diode assembly according to a further embodiment of the present disclosure.

According to another aspect of the present disclosure, the light emitting diode assembly may further comprise encapsulating glue 6 which covers the whole surface of the opening of the mounting groove of the lamp base. Particularly, as shown in FIG. 3, a surface of the encapsulating glue 6 is in an outwardly convex arcuate shape, an outwardly convex height is less than or equal to twice a thickness of the LED die 3, and this structure makes the exit light evener.

Embodiments of the present disclosure further provide a backlight module comprising the above-mentioned light emitting diode assembly. The above-mentioned light emitting diode assembly may be used for a bottom-incident type backlight module, without using a lens and reducing cost of materials; the light emitting diode assembly may also be used for a side-incident type backlight module, can solve firefly disturbance and thereby design a product with a narrower frame edge.

Embodiments of the present disclosure further provide a liquid crystal display, including the aforesaid backlight module.

Embodiments of the present disclosure further provide an illumination device, comprising the aforesaid light emitting diode assembly. This kind of illumination device has a very large illumination angle.

It will be apparent to those skilled in the art that various modifications and variations can be made to embodiments in the present disclosure without departing from the scope or spirit of the disclosure. As such, all such modifications and variations are intended to be included within the scope of the present disclosure, provided that they fall within the scope of the claims of the present disclosure and equivalents thereof.

The invention claimed is:

1. An LED assembly, comprising:
   a lamp base, a central portion of the lamp base being inwardly concave to form a mounting groove;
   at least one pair of LED dies, wherein each pair of LED dies is mounted on a bottom surface of the mounting groove, two LED dies in each pair of LED dies are disposed symmetrically about an axis of the mounting groove, light exit surfaces of the two LED dies are opposite to the bottom surface of the mounting groove, and among angles formed by intersection of planes where the light exit surfaces of the two LED dies lie, an angle facing the bottom surface of the mounting groove is greater than 0 degree and less than 180 degrees.

2. The LED assembly according to claim 1, wherein the angle facing towards the bottom surface of the mounting groove is greater than 120 degrees and less than 180 degrees.

3. The LED assembly according to claim 1, wherein bases are provided at the bottom surface of the mounting groove, and each of said LED dies is mounted on one of the bases.

4. The LED assembly according to claim 3, wherein a lateral side of the mounting groove is a conical surface structure, and the bottom surface of the mounting groove is a convex surface structure which is convex towards an opening of the mounting groove, and an axis of the convex surface structure coincides with an axis of the conical surface structure; or the lateral side of the mounting groove is a conical surface structure, the bottom surface of the mounting groove is a plane, and a cross section of the base has a wedge structure.

5. The LED assembly according to claim 4, wherein when the bottom surface of the mounting groove is a convex surface structure which is convex towards the opening of the mounting groove, the bottom surface of mounting groove is a semi-spherical structure; or the bottom surface of the mounting groove is a convex surface structure with a plurality of facets spliced together.

6. The LED assembly according to claim 3, wherein, the bottom surface of the mounting groove is further provided with a metal joint, a metal wire is provided in each of the bases, one electrode of each of said LED dies is electrically connected to the metal joint via a metal wire, and the other electrode of each of said LED dies is electrically connected to the metal wire in the corresponding base via a metal wire.

7. The LED assembly according to claim 1, wherein the LED assembly further comprises encapsulating glue which covers the whole surface of the opening of the mounting groove of the lamp base, a surface of the encapsulating glue is in an outwardly convex arcuate shape, and an outwardly convex height is less than or equal to twice a thickness of the LED die.

8. A backlight module, comprising a light source which includes the LED assembly according to claim 1.

9. A liquid crystal display, including the backlight module according to claim 8.

10. An illumination device, comprising the LED assembly according to claim 1.

* * * * *